United States Patent
Attal et al.

(10) Patent No.: US 10,504,693 B2
(45) Date of Patent: Dec. 10, 2019

(54) EVALUATING AN OBJECT

(71) Applicant: Applied Materials Israel Ltd., Rehovot (IL)

(72) Inventors: Shay Attal, Rehovot (IL); Shaul Cohen, Irus (IL); Guy Maoz, Rosh Pina (IL); Noam Zac, Kefar Sava (IL); Mor Baram, Ness Ziona (IL); Lee Moldovan, Tel-Aviv (IL); Ishai Schwarzband, Or-Yehuda (IL); Ron Katzir, Tel Aviv (IL); Kfir Ben-Zikri, Netivot (IL); Doron Girmonsky, Raanana (IL)

(73) Assignee: Applied Materials Israel Ltd., Rehovot (IL)

( * ) Notice: Subject to any disclaimer, the term of this patent is extended or adjusted under 35 U.S.C. 154(b) by 0 days.

(21) Appl. No.: 16/131,289

(22) Filed: Sep. 14, 2018

(65) Prior Publication Data

US 2019/0088444 A1    Mar. 21, 2019

Related U.S. Application Data

(60) Provisional application No. 62/560,050, filed on Sep. 18, 2017.

(51) Int. Cl.
*H01J 37/244* (2006.01)
*H01J 37/29* (2006.01)
*G01B 15/02* (2006.01)
*G01B 15/04* (2006.01)

(52) U.S. Cl.
CPC ............ *H01J 37/244* (2013.01); *G01B 15/02* (2013.01); *G01B 15/04* (2013.01); *H01J 37/29* (2013.01); *G01B 2210/56* (2013.01)

(58) Field of Classification Search
USPC ........................................ 250/307, 306, 310
See application file for complete search history.

(56) References Cited

U.S. PATENT DOCUMENTS 6,232,787 B1 *   5/2001   Lo .......................... H01J 37/268
                                                                250/311
2004/0228515 A1 * 11/2004   Okabe ................... G06T 7/0004
                                                                382/145

* cited by examiner

*Primary Examiner* — Kiet T Nguyen
(74) *Attorney, Agent, or Firm* — Kilpatrick Townsend & Stockton LLP

(57) ABSTRACT

A method for evaluating an object, the method may include acquiring, by a charged particle beam system, an image of an area of a reference object, wherein the area includes multiple instances of a structure of interest, and the structure of interest is of a nanometric scale; determining multiple types of attributes from the image; reducing a number of the attributes to provide reduced attribute information; generating guidelines, based on the reduced attribute information and on reference data, for evaluating the reduced attribute information; and evaluating an actual object by implementing the guidelines.

15 Claims, 5 Drawing Sheets

300

310 — Training a neural network to output data that approximates reference parameters from a reference object when fed with reduced attribute information about the reference object, while attempting to reduce a number of attributes (of the reduced attribute information) that are taken into account during approximation of the reference parameters.

320 — Determining how to perform attribute reduction based on the attributes that were ignored by the neural network.

*FIG. 4*

EVALUATING AN OBJECT

CROSS-REFERENCE TO RELATED APPLICATIONS

This application claims the benefit of U.S. Provisional Application No. 62/560,050, filed Sep. 18, 2017, the entire contents of which are incorporated herein by reference in their entirety for all purposes.

FIELD OF THE INVENTION

Embodiments described herein relate generally to measurements of feature heights and/or structure depths on a substrate using a charged particle beam system.

BACKGROUND

There is a growing need to evaluate objects that have nanometric structures—especially nanometric structures that are located within deep and narrow recesses.

SUMMARY

There may be provided methods, systems and computer program products for evaluating an object. In some embodiments, evaluating an object includes performing measurements of feature heights and/or structure depths using charged particle beam systems. In accordance with an embodiment, for example, a method for evaluating an object includes acquiring, by a charged particle beam system, an image of an area of a reference object, where the area comprises multiple instances of a structure of interest, and the structure of interest is of a nanometric scale. The method also includes determining multiple types of attributes from the image, reducing a number of the attributes to provide reduced attribute information, and generating guidelines, based on the reduced attribute information and on reference data, for evaluating the reduced attribute information. An actual object may be evaluated by implementing the guidelines.

In an embodiment, a resolution of the image is at least one hundred times finer than a resolution of the reference data.

In another embodiment, the image is a backscattered electron image of nanometric scale resolution. Acquiring the image may comprise collecting backscattered electrons by a backscattered electron detector that has a radial angular coverage range of tens of degrees. Acquiring the image may also comprise rejecting secondary electrons by an energy filter that precedes the backscattered electron detector.

In another embodiment, the multiple instances of the structure of interest are positioned in recesses having an aspect ratio that exceeds ten, and acquiring the image comprises scanning the area with a charged particle beam having a focal plane at a height related to a height of the multiple instances of the structure of interest.

In another embodiment, generating the guidelines comprises training a neural network to output data that approximates the reference data when fed with the reduced attribute information.

In another embodiment, reducing the number of attributes comprises utilizing a neural network.

In yet another embodiment, reducing the number of attributes comprises training a neural network to output data that approximates the reference data regarding a reference object when fed with the reduced attribute information about the reference object, while attempting to reduce the number of attributes that are taken into account during an approximation of the reference data. Training the neural network may comprise calculating a cost function related to the number of attributes of the reduced attribute information that are taken into account during the approximation of the reference data.

In accordance with another embodiment, a nontransitory computer program product that stores instructions for evaluating an object includes instructions for acquiring an image of an area of a reference object, where the area comprises multiple instances of a structure of interest, and the structure of interest is of a nanometric scale. The instructions for evaluating the object also include instructions for determining multiple types of attributes from the image, reducing a number of the attributes to provide reduced attribute information, and generating guidelines, based on the reduced attribute information and on reference data, for evaluating the reduced attribute information. The instructions for evaluating the object may also include instructions for evaluating an actual object by implementing the guidelines.

In accordance with yet another embodiment, a method for measuring depths and/or heights of structures on a substrate includes acquiring, by a charged particle beam system, a backscattered electron image of an area of a reference object, where the area comprises multiple instances of a structure of interest, the structure of interest is positioned in a recess having an aspect ratio that exceeds ten, and the structure of interest is of a nanometric scale. The method also includes determining multiple types of attributes from the image, reducing a number of the attributes to provide reduced attribute information, and generating guidelines, based on the reduced attribute information and on reference data, for evaluating the reduced attribute information. Generating the guidelines may include training a neural network to output data that approximates the reference data when fed with the reduced attribute information. An actual object may be evaluated by implementing the guidelines.

In an embodiment, a resolution of the image is at least one hundred times finer than a resolution of the reference data.

In another embodiment, acquiring the backscattered electron image includes collecting backscattered electrons by a backscattered electron detector that has a radial angular coverage range of tens of degrees. Acquiring the backscattered electron image may include rejecting secondary electrons using an energy filter that precedes the backscattered electron detector.

BRIEF DESCRIPTION OF THE DRAWINGS

The embodiments described herein, both as to organization and method of operation, together with objects, features, and advantages thereof, may best be understood by reference to the following detailed description when read with the accompanying drawings in which:

FIG. 4 is an example of a method for training a neural network in accordance with an embodiment.

DETAILED DESCRIPTION OF THE DRAWINGS

Figure 1:
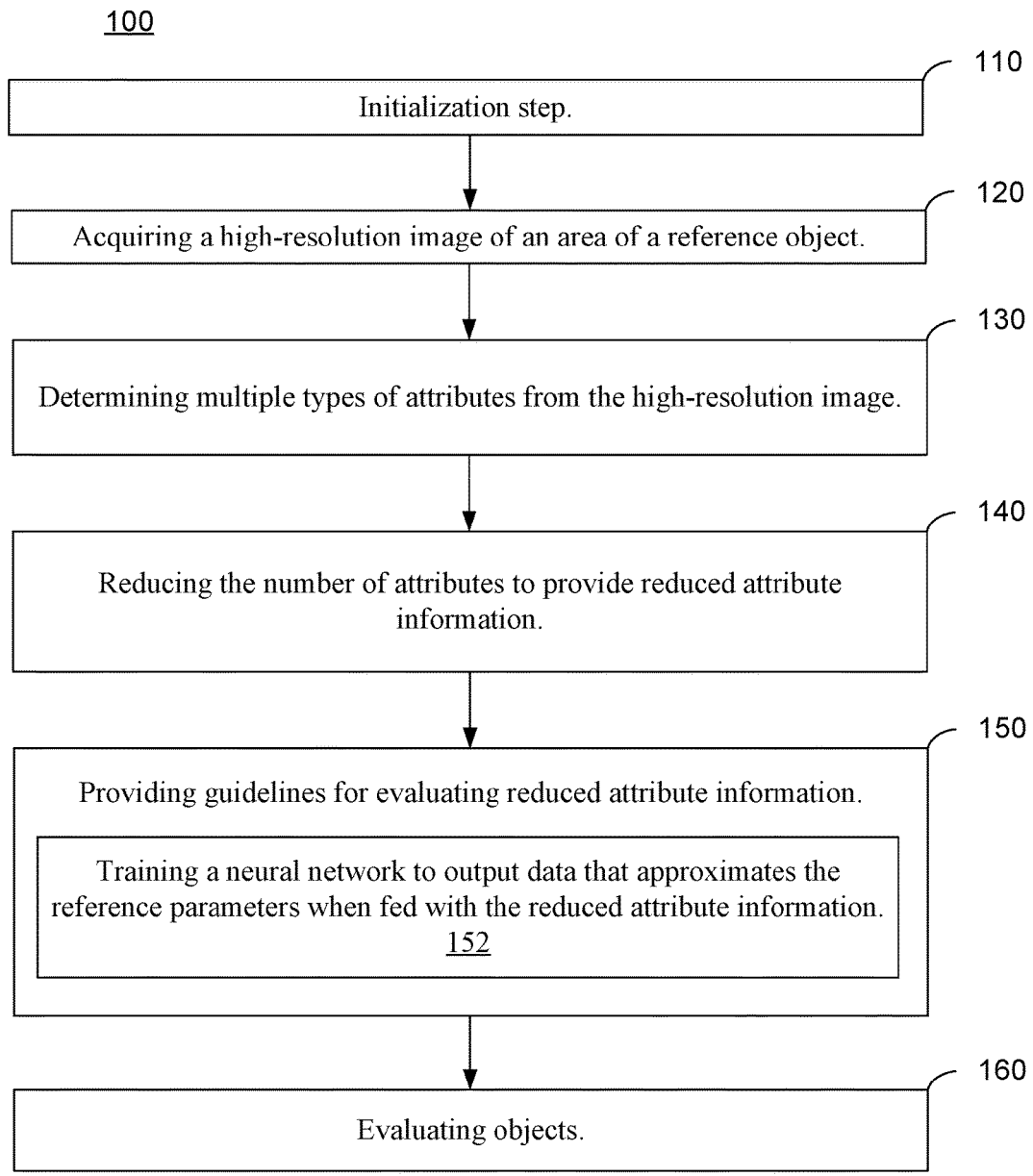
FIG. 1 is an example of a method for evaluating an object in accordance with an embodiment.

In the following detailed description, numerous specific details are set forth in order to provide a thorough understanding of the embodiments described herein. However, it will be understood by those skilled in the art that the embodiments may be practiced without these specific details. In other instances, well-known methods, procedures, and components have not been described in detail so as not to obscure the embodiments described herein.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

Because the illustrated embodiments may, for the most part, be implemented using electronic components and circuits known to those skilled in the art, details will not be explained in any greater extent than considered necessary as illustrated above, for the understanding and appreciation of the underlying concepts and in order not to obfuscate or distract from the teachings of the embodiments described herein.

Any reference in the specification to a method should be applied mutatis mutandis to a system capable of executing the method and should be applied mutatis mutandis to a non-transitory computer program product that stores instructions that once executed by a computer result in the execution of the method.

Any reference in the specification to a system should be applied mutatis mutandis to a method that may be executed by the system and should be applied mutatis mutandis to a non-transitory computer program product that stores instructions that may be executed by the system.

Any reference in the specification to a non-transitory computer program product should be applied mutatis mutandis to a system capable of executing the instructions stored in the non-transitory computer program product and should be applied mutatis mutandis to method that may be executed by a computer that reads the instructions stored in the non-transitory computer program product.

The term "comprising" is synonymous with (means the same thing as) "including," "containing" or "having" and is inclusive or open-ended and does not exclude additional, unrecited elements or method steps.

The term "consisting" is a closed (only includes exactly what is stated) and excludes any additional, unrecited elements or method steps.

The term "consisting essentially of" limits the scope to specified materials or steps and those that do not materially affect the basic and novel characteristics.

In the claims and specification any reference to the term "comprising" (or "including" or "containing") should be applied mutatis mutandis to the term "consisting" and should be applied mutatis mutandis to the phrase "consisting essentially of".

The following text includes various examples that refer to a scanning electron microscope (SEM) that generates a backscattered electron (BSE) image. It should be noted that SEM is a non-limiting example of a charged particle microscope or a charged particle beam system. The charged particles may be electrons or ions. Other examples of charge particle beam systems include transmission electron microscopes (TEMs), ion microscopes, scanning transmission electron microscopes (STEMs), and the like.

FIG. 1 illustrates an example of method 100 for evaluating an object in accordance with an embodiment.

Method 100 may start by a training process.

The training process may include steps 110, 120, 130, 140, and 150. The training process may be used to generate a measurement model or recipe for a charged particle beam system that can be used to measure feature heights and/or structure depths on a substrate.

Step 110 is an initialization step.

Step 110 may include setting and/or receiving parameters such as but not limited to at least some of the following parameters:
 a. Charged particle beam system parameters, such as focal point, acceleration voltage, beam shape, beam size, and the like.
 b. Detector parameters such as type of detector that is being used, value of energy filter, and the like.
 c. Scan parameters used by the charged particle beam system.
 d. Reference data (reference data parameters or reference sample parameters).

A structure of interest may be of nanometric scale. A structure of interest may be a height of a feature on a substrate and/or a depth of a structure on a substrate. The substrate may be, for example, a semiconductor wafer. One or more instances of the structure of interest may be positioned in recesses on the substrate having a high aspect ratio (for example, an aspect above 10, between 20 and 200, and the like). An aspect ratio is the ratio between the depth of the recess and the width of the recess.

The reference data may be provided by a third party or generated during step 110. For example, the reference data may include design data, measurements of feature heights and/or structure depths on reference substrates, measurements of other structures on reference substrates, measurements of structures on reference substrates using other measurement tools (e.g., optical critical dimension (OCD) measurements, transmission electron microscopy (TEM) measurements), and the like.

The reference data may represent one or more reference objects that are error free, or at least of an acceptable quality. The quality level that is regarded as acceptable may be defined by a third party such as but not limited to a manufacturer of the object or a client.

The reference data may be of a coarser resolution that the high-resolution image acquired during step 120.

The focal point of the charged particle beam system may be set to fit the structures of interest.

For example—the focal point may be set based on a bottom of the recesses on a substrate and/or based on heights of the structures (e.g., source-drain structures) located within the recesses.

The focal point may or may not differ from a focal point that is set as a trade-off between expected heights of gate structures and/or other structures that are positioned above the recesses or form a part of the sidewalls of the recesses.

The detector that is being used by the charged particle beam system may be a backscattered electron (BSE) detector—and in some embodiments a large angle backscattered electron detector that may collect backscattered electrons emitted from an object or substrate over a large angular range.

For example—assuming that the object is illuminated by a charged particle beam that is approximately normal (or perpendicular) to the object—then a large angular range may cover angles that deviate from normal by between about thirty and about seventy degrees. At least some of the backscattered electrons that are emitted at smaller angular ranges (for example between zero and about thirty degrees deviation from normal) may be collected by an in-lens backscattered electron detector.

Using a charged particle beam system having a backscattered electron detector—and in some embodiments a large angle backscattered electron detector—may be highly efficient when the instances of the structure of interest are located at the bottom of high-aspect ratio recesses.

A signal to noise ratio (SNR) of the detection signals generated when the charged particles impinge on the substrate may be improved by using an energy filter that is positioned before the large angle backscattered electron detector. The energy filter may be tuned (set to a filtering voltage) that rejects electrons that differ in energy from the backscattered electrons. For example—the energy filter may reject secondary electrons.

It should be noted that at least one other detector may be used by the charged particle beam system—in addition to the large angle backscattered electron detector. The additional detector may be an in-lens backscattered electron detector, a secondary electron detector, and the like.

Collecting electrons that are emitted from the substrate in different directions may provide additional information about the structures of interest—such as height and/or depth information.

The large angle backscattered electron detector may include multiple segments for collecting backscattered electrons that are emitted from the substrate in different directions.

One or more other detectors may also provide information from different directions.

Step 110 may be executed during a set-up phase. The set-up phase may be part of a model generation or a recipe creation process.

Step 110 may be executed manually, semi-automatically, or automatically.

Step 110 may be followed by step 120 that includes acquiring a high-resolution image of an area of a reference object. The high-resolution image may be an image of nanometric scale resolution obtained using the charged particle beam system, and the reference object may be a reference substrate.

The high-resolution image may be obtained using techniques and/or measurement tools that are different than those used to obtain the reference data. For example—the reference data may be design data, data acquired by optical tools, and the like.

Step 120 may be repeated multiple times—for different areas of the reference object and/or for different reference objects.

Reference objects may be similar to each other but may differ in certain aspects. For example—different reference objects may be manufactured using one or more different manufacturing parameters. Yet as another example—the structures of interest and/or the other patterns of different reference objects may differ from each other (for example—different lengths, different widths, different sizes, and the like).

Step 120 may include generating the high-resolution image. Generating the high-resolution image may include scanning the area with a charged particle beam that has a nanometric scale cross section.

The high-resolution image provides details about the shape and/or size of instances of the structure of interest and about instances of other structures. The instances of the other structures may be positioned outside the recesses, may form a part of the recesses, and the like.

Step 120 may include receiving but not generating the high-resolution image.

Step 120 may be followed by step 130 of determining multiple types of attributes from the high-resolution image. The multiple types of attributes may exceed ten, twenty, fifty, one hundred, and the like.

When multiple high-resolution images are generated during step 120—then step 130 may be applied on each of the high-resolution images.

The attributes may refer to distances between different features on the reference substrate that are captured by the high-resolution image, differences in gray levels of pixels associated with the different features, and the like.

Different types of attributes may represent at least some of the following: a width of an instance of a structure of interest, a length of an instance of a structure of interest, a distance between two different points of a structure of interest, a distance between instances of a structure of interest, a distance between an instance of a structure of interest and an instance of another structure, a width of an instance of another structure, a length of an instance of another structure, a distance between two different points of an instance of another structure, one or more gray levels of pixels that represent an instance of at least part of a structure of interest, one or more gray levels of pixels that represent at least part of an instance of another structure, one or more gray levels of pixels that represent at least part of an instance of another structure and a structure of interest, and the like.

An attribute that represents one or more gray levels may be an average gray level, an extremum gray level, any weighted sum of the gray levels, differences between the gray levels, or any function applied on one or more of the gray levels.

An attribute may be generated by applying a function (such as a statistical function) on multiple pixels. For example—a width of an instance of a structure of interest may be an average of multiple width measurements. The width of an instance of a structure of interest may be a critical dimension of the instance of a structure of interest.

The high-resolution image may include information about multiple instances of the structure of interest (for example—more than 100, 1000, 10000, 100000, 1000000, and even more).

There may be many different types of attributes and there may be many different instances of a structure of interest. Accordingly—step 130 may provide a vast amount of data.

Step 130 may include assigning a confidence level to the attributes.

The confidence level may be responsive to physical information. The physical information may include expected shape and/or size of the structures of interest and/or other structures. An attribute that is indicative of a deviation from the physical information (by at least a certain threshold) may be rejected and/or assigned a low confidence level.

The confidence level may be a statistical parameter. For example—a given height attribute may have a given value with a statistical confidence level.

The confidence level may be responsive to the generation process of the high-resolution image. For example—certain measurements may be more reliable than others. For example—measurements with a higher SNR may be deemed to be more reliable than measurements with a lower SNR. Yet as another example—edge measurements may have a different confidence level than measurements of a plateau. Measurements related to structures of different materials and/or structures positioned at different heights may have different confidence levels.

Step 130 may be followed by step 140 of reducing the number of attributes to provide reduced attribute information.

When multiple high-resolution images are generated during step 120—the reduction may be responsive to attributes of different high-resolution images. For example—attributes that change in response to changes between different reference objects may be of a higher value than attributes that are indifferent to such changes.

The reduction may include rejecting attributes and/or replacing one or more types of attributes with other types of attributes.

The reduction may be determined based on at least one of the following:
 a. Differences between an amount of reference data and aggregate information provided by all the attributes. This may occur when the reference data has fewer parameters than the attributes generated from the high-resolution image.
 b. Difference between resolution of the reference data and the resolution of the high-resolution image (for example—micron scale information of the reference data versus nanometer scale of the high-resolution image).
 c. A tolerance to variations between objects and/or a tolerance to variations in the high-resolution image itself
 d. Required tolerance of a machine learning process that is trained by the attributes and the reference parameters.
 e. Physical information about the object. The physical information may include expected shape and/or size of structures of interest and/or the other structures. An attribute that is indicative of a deviation from the physical information may be rejected and/or assigned a low confidence level.

When a machine learning process is trained using the reference parameters and the reduced attribute information, then a reduction in the number of attributes can cause the machine learning process to be more tolerant to variations in the objects and/or to be more tolerant to variations in the high-resolution image.

The reduction may include reducing the number of attributes by reducing attributes that are correlated to each other, reducing combinations of attributes that are correlated to each other, reducing attributes that do not provide relevant information, applying statistical techniques for variation analysis, and the like.

The reduction may also include clustering the attributes and generating cluster attributes that represent values of the attributes of each cluster. The cluster attributes may be generated by applying statistical or other functions on the attributes of each cluster. For example—weighted sum, average, mean, standard deviation, and the like.

The clustering may be defined using clustering techniques and/or by using physical information about the structures of interest and/or about the other structures. For example: two structures at known locations having similar heights.

Step 140 may be followed by step 150 of providing guidelines for evaluating the reduced attribute information. These guidelines may be the outcome of the training process.

Step 150 may include determining a relationship between the reference parameters and the reduced attribute information.

The training process may be followed by step 160 of evaluating or measuring objects. The objects that are evaluated during step 160 are actual objects or substrates that may differ from one or more of the reference objects of step 120.

Step 160 may include:
 a. Initialization step.
 b. Acquiring a high-resolution image of an area of an actual object.
 c. Determining multiple types of attributes from the high-resolution image.
 d. Reducing the number of attributes to provide reduced attribute information. Step 140 may provide the guidelines for reduction—which attributes to select and/or how to generate cluster attributes.
 e. Applying the guidelines of step 150 to the reduced attribute information to provide evaluation results. The evaluation results may be indicative of the state of the patterns of interest in the area of the actual object.

The training process and the evaluation process may or may not include using a machine learning process.

Step 160 may include applying the guidelines of step 150 by a neural network that was trained during the training process.

Step 150 may include step 152 of training a neural network to output data that approximates the reference parameters when fed with the reduced attribute information generated during step 140.

The outcome of step 152 provides guidelines for evaluating the reduced attribute information. These guidelines may be viewed as a model or an estimator.

Step 152 may involve multiple iterations. The iterations may differ from each other by the configuration of the neural network. For example, the neural network may change at least one of a weight of at least one neuron between one iteration to another.

The outputs of each iteration may be evaluated.

The model or estimator may be subjected to one or more criteria—tolerance to variations in the reduced attribute information, differences between the reference parameters and the output of the neural network, number of attributes that are taken into account by the neural network, and the like.

The difference between the reference parameters and the output of the neural network may be calculated in various manners—for example mean square error, error, and the like.

The model or estimator may be selected by applying a target function on the outputs of the neural network. The target function may be based on operational needs.

The neural network may be fed by confidence levels of the reduced attribute information and the target function may be responsive to the confidence levels.

Figure 2:
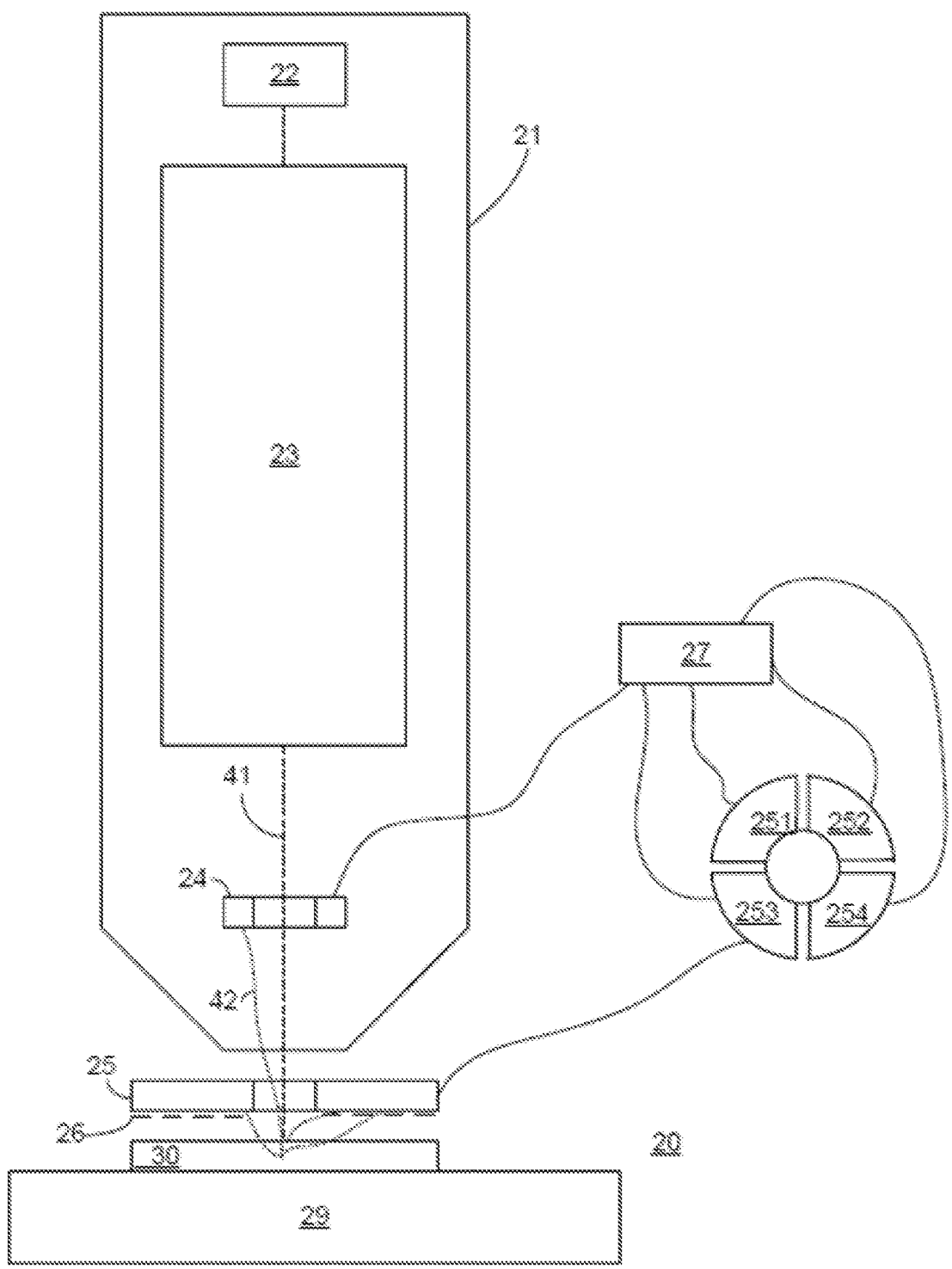
FIG. 2 is a simplified example of an exemplary charged particle beam system in accordance with an embodiment.

FIG. 2 is a simplified example of an exemplary charged particle beam system 20 in accordance with an embodiment.

System 20 may be a scanning electron microscope (SEM) or another charged particle beam system. System 20 includes column 21, large angle detector 25, and a mechanical stage 29.

System 20 may include other components that are not shown in this figure for simplicity of explanation. The other components may include a vacuum chamber, an optical microscope, various in-column detectors, various external columns, and the like. Any detector may be a secondary electron detector, a backscattered electron detector, an energy dispersive spectrometry (EDX) detector, and the like.

Mechanical stage 29 supports wafer 30 and may move wafer 30 in relation to column 21.

Column 21 is configured to generate a primary beam (e.g., an electron beam or a charged particle beam), to electrically deflect the primary beam, and to detect particles emitted from the wafer 30.

Column 21 is illustrated as including a source 22, optics 23, and an in-column detector 24. The optics 23 may deflect the primary beam, shape the primary beam, and the like. Components of the optics 23 may include polarizers, deflectors, collimators, and the like.

The large angle detector 25 is positioned between column 21 and wafer 30.

FIG. 2 illustrates the large angle detector 25 as including four segments 251, 252, 253 and 254. Each segment is in the shape of an arc that spans along about ninety degrees. It should be noted that the large angle detector 25 may include any number of segments and that the segments may have other shapes and/or sizes.

The detection signals from the large angle detector 25 (especially the detection signals from different segments) may be fed to a processor 27.

Processor 27 may receive detection signals from other detectors. Processor 27 may process the detection signals and may generate the high-resolution image of an area of wafer 30 that is being scanned by the primary beam 41. Particles emitted from the wafer 30 are denoted 42. The particles may include, for example, backscattered electrons, secondary electrons, and the like.

Processor 27 may be included in system 20 or may be located in another computerized system. Processor 27 may represent a combination of processing elements of system 20 and processing elements of the other computerized system.

The large angle detector 25 is preceded by energy filter 26.

The energy filter 26 and the large angle detector 25 have a central aperture for allowing the propagation of the primary beam 41 towards wafer 30, and to allow particles that impinge at small angles (in relation to normal from an upper surface of wafer 30) to propagate towards in-column detectors such as in-column detector 24.

System 20 may collect particles from different directions—thus providing directional information that may assist in generating topographic information—or at least height and/or depth information about structures on wafer 30.

The different directions of collection may be implemented by the different segments of the large angle detector 25 and/or by other detectors.

Figure 3:
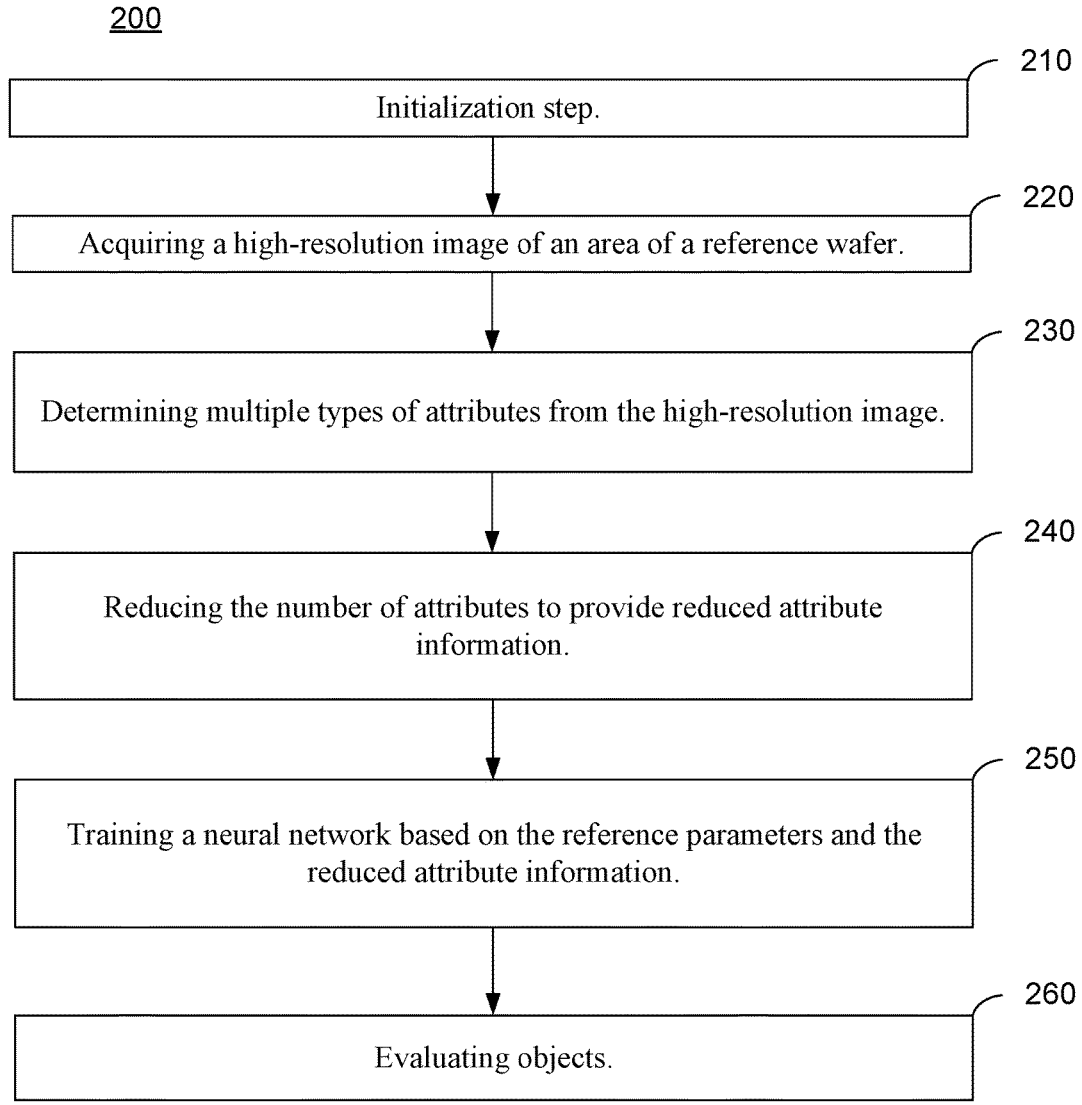
FIG. 3 is an example of a method for evaluating an object in accordance with another embodiment.

FIG. 3 is an example of a method 200 for evaluating an object in accordance with an embodiment.

Method 200 may start by a training process.

The training process may include steps 210, 220, 230, 240 and 250. The training process may be used to generate a measurement model or recipe for a charged particle beam system that can be used to measure feature heights and/or structure depths on a substrate.

Step 210 is an initialization step.

Method 200 may include scanning a semiconductor substrate such as the wafer 30 of FIG. 2, using a scanning electron microscope with a large angle backscattered electron detector that has multiple segments, and using an energy filter that is set to reject secondary electrons from reaching the large angle backscattered electron detector.

Step 210 may include:
  a. Setting the focal point of the scanning electron microscope to be at the bottom of a recess on the substrate—or setting it to any height related to a structure of interest on the substrate.
  b. Setting the energy filter to reject secondary electrons.

The reference parameters may be obtained from multiple reference objects. In this example, the reference objects include at least three wafers of acceptable quality that differ from each other recess depth. The reference parameters may be of microscopic resolution and may include optical critical dimension (OCD) data.

Step 210 may be followed by step 220 of acquiring a high-resolution image of an area on one of the reference wafers. The high-resolution image may be a high-resolution backscattered electron image of the area.

Step 220 may be repeated multiple times in order to acquire high-resolution backscattered electron images of at least one area on each of the other reference wafers.

Step 220 may be followed by step 230 of determining multiple types of attributes from the high-resolution image.

Step 230 may be repeated for each of the high-resolution backscattered electron images acquired during step 220.

Step 230 may be followed by step 240 of reducing the number of attributes to provide reduced attribute information.

The reduction may take into account values of attributes that are obtained for different high-resolution images obtained during step 220.

Step 240 may be followed by step 250 of training a neural network based on the reference parameters and the reduced attribute information. The reference parameters and the attribute information may be obtained from the reference wafers.

The training may be responsive to other constraints—such as the number of attributes used.

Step 250 may includes steps that are similar to those of step 152 described above with reference to FIG. 1.

The training process may be followed by step 260 of evaluating or measuring objects. The objects that are evaluated during step 260 are actual objects or substrates that may differ from one or more reference objects of step 220.

Step 260 may include:
  a. Initialization step.
  b. Acquiring a high-resolution backscattered electron image of an area of an actual object.
  c. Determining multiple types of attributes from the high-resolution backscattered electron image.
  d. Reducing the number of attributes to provide reduced attribute information. Step 240 may provide the guidelines for reduction—which attributes to select and/or how to generate cluster attributes.
  e. Using the trained neural network to provide evaluation results.

FIG. 4 illustrates an example of a method 300 for training a neural network in accordance with an embodiment.

Method 300 starts with step 310 of training a neural network to output data that approximates reference parameters from a reference object when fed with reduced attribute information about the reference object. Step 310 includes attempting to reduce a number of attributes (of the reduced attribute information) that are taken into account during approximation of the reference parameters.

Step 310 may include applying a cost function that calculates a cost of using the different attributes.

Step 310 may involve multiple iterations. The iterations may differ from each other by the configuration of the neural network and/or may differ from each other by cost function parameters.

Each iteration may include:
  a. Setting of the neural network and/or determining the parameters of the cost function.

b. Generating an output by the neural network.

c. Evaluating the output of the neural network and finding which attributes were ignored.

For example, the neural network may change a weight of at least one neuron between one iteration to another.

Yet as another example, a fine associated with using attributes may be changed between one iteration to another.

The outputs of each iteration may be evaluated.

The evaluation may take into account the cost function and one or more parameters of the model or estimator generated by the neural network.

The cost function may be changed over time thereby causing the neural network to change the number of attributes that are ignored by the neural network.

A change in the cost function over time may be required in order to reach a predefined number of ignored attributes. This predefined number of ignored attributes may not be known in advance.

Step 310 may be followed by step 320 of determining how to perform attribute reduction based on the attributes that were ignored by the neural network.

Figure 5:
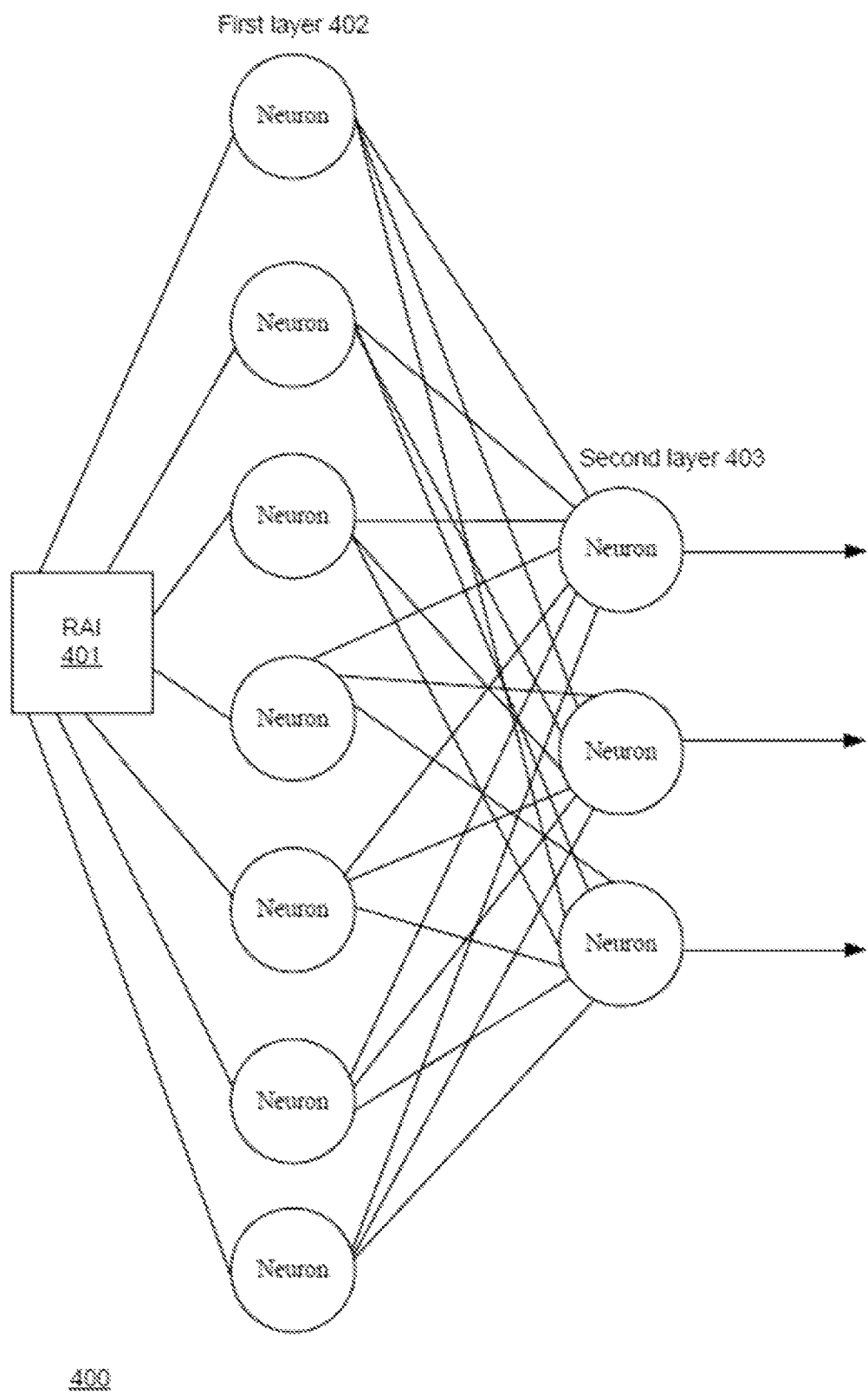
FIG. 5 is a simplified drawing of an exemplary neural network that may be used with some of the embodiments described herein.

FIG. 5 is simplified drawing of a neural network 400 that may be used with some of the embodiments described herein.

Neural network 400 is fed by reduced attribute information (denoted RAI 401). Neural network 400 includes first layer neurons 402 that are fed by the reduced attribute information and second layer neurons 403 that are fed by the first layer neurons 402.

Neural network 400 may be trained during any of the methods 100, 200, and/or 300 described herein.

Other neural networks may also be trained during the methods 100, 200, and/or 300.

It has been found that having a non-linear and compact neural network—one that includes few levels of neurons (for example—two levels)—may be sufficient for the training processes of the methods 100, 200, and 300.

The non-linearity of the neural network may be obtained, for example, by multiplying and/or dividing various outputs of the first layer neurons 402 by the second layer neurons 403.

The methods 100, 200, and/or 300 provide a highly accurate process for evaluating multiple instances of a structure of interest, even under complex and problematic conditions.

Any of the mentioned above methods may also be implemented in a computer program for running on a computer system, at least including code portions for performing steps of a method when run on a programmable apparatus, such as a computer system, or enabling a programmable apparatus to perform functions of a device or system according to embodiments described herein. The computer program may cause the storage system to allocate disk drives to disk drive groups.

A computer program is a list of instructions such as a particular application program and/or an operating system. The computer program may, for instance, include one or more of: a subroutine, a function, a procedure, an object method, an object implementation, an executable application, an applet, a servlet, a source code, an object code, a shared library/dynamic load library and/or other sequence of instructions designed for execution on a computer system, and the like.

The computer program may be stored internally on a non-transitory computer program product. All or some of the computer program may be provided on computer readable media permanently, removably or remotely coupled to an information processing system. The computer readable media may include, for example and without limitation, any number of the following: magnetic storage media including disk and tape storage media; optical storage media such as compact disk media (e.g., CD-ROM, CD-R, etc.) and digital video disk storage media; nonvolatile memory storage media including semiconductor-based memory units such as FLASH memory, EEPROM, EPROM, ROM; ferromagnetic digital memories; MRAM; volatile storage media including registers, buffers or caches, main memory, RAM, etc. A computer process typically includes an executing (running) program or portion of a program, current program values and state information, and the resources used by the operating system to manage the execution of the process. An operating system (OS) is the software that manages the sharing of the resources of a computer and provides programmers with an interface used to access those resources. An operating system processes system data and user input, and responds by allocating and managing tasks and internal system resources as a service to users and programs of the system. The computer system may, for instance, include at least one processing unit, associated memory and a number of input/output (I/O) devices. When executing the computer program, the computer system processes information according to the computer program and produces resultant output information via I/O devices.

In the foregoing specification, embodiments have been described with reference to specific examples. It will, however, be evident that various modifications and changes may be made therein without departing from the broader spirit and scope of the invention as set forth in the appended claims.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments described herein are, for example, capable of operation in other orientations than those illustrated or otherwise described herein.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures may be implemented which achieve the same functionality.

Any arrangement of components to achieve the same functionality is effectively "associated" such that the desired functionality is achieved. Hence, any two components herein combined to achieve a particular functionality may be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the above described operations are merely illustrative. The multiple operations may be combined into a single operation, a single operation may be distributed in additional operations, and operations may be executed at least partially overlapping in time. Moreover, alternative embodiments may include multiple instances of a particular operation, and the order of operations may be altered in various other embodiments.

Also, for example, in one embodiment, the illustrated examples may be implemented as circuitry located on a single integrated circuit or within a same device. Alternatively, the examples may be implemented as any number of separate integrated circuits or separate devices interconnected with each other in a suitable manner.

Also, for example, the examples, or portions thereof may implemented as soft or code representations of physical circuitry or of logical representations convertible into physical circuitry, such as in a hardware description language of any appropriate type.

Also, the embodiments described herein are not limited to physical devices or units implemented in non-programmable hardware but can also be applied in programmable devices or units able to perform the desired device functions by operating in accordance with suitable program code, such as mainframes, minicomputers, servers, workstations, personal computers, notepads, personal digital assistants, electronic games, automotive and other embedded systems, cell phones, and various other wireless devices, commonly denoted in this application as 'computer systems'.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

While certain features have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

We claim:

1. A method for evaluating an object, the method comprising:
    acquiring, by a charged particle beam system, an image of an area of a reference object, wherein the area comprises multiple instances of a structure of interest, and the structure of interest is of a nanometric scale;
    determining multiple types of attributes from the image;
    reducing a number of the attributes to provide reduced attribute information;
    generating guidelines, based on the reduced attribute information and on reference data, for evaluating the reduced attribute information; and
    evaluating an actual object by implementing the guidelines.

2. The method according to claim 1, wherein a resolution of the image is at least one hundred times finer than a resolution of the reference data.

3. The method according to claim 1, wherein the image is a backscattered electron image of nanometric scale resolution.

4. The method according to claim 3, wherein acquiring the image comprises collecting backscattered electrons by a backscattered electron detector that has a radial angular coverage range of tens of degrees.

5. The method according to claim 4, wherein acquiring the image comprises rejecting secondary electrons by an energy filter that precedes the backscattered electron detector.

6. The method according to claim 1, wherein the multiple instances of the structure of interest are positioned in recesses having an aspect ratio that exceeds ten, and wherein acquiring the image comprises scanning the area with a charged particle beam having a focal plane at a height related to a height of the multiple instances of the structure of interest.

7. The method according to claim 1, wherein generating the guidelines comprises training a neural network to output data that approximates the reference data when fed with the reduced attribute information.

8. The method according to claim 1, wherein reducing the number of attributes comprises utilizing a neural network.

9. The method according to claim 1, wherein reducing the number of attributes comprises training a neural network to output data that approximates the reference data regarding a reference object when fed with the reduced attribute information about the reference object, while attempting to reduce the number of attributes that are taken into account during an approximation of the reference data.

10. The method according to claim 9, wherein training the neural network comprises calculating a cost function related to the number of attributes of the reduced attribute information that are taken into account during the approximation of the reference data.

11. A nontransitory computer program product that stores instructions for evaluating an object, the instructions comprising the steps of:
    acquiring an image of an area of a reference object; wherein the area comprises multiple instances of a structure of interest, and the structure of interest is of a nanometric scale;
    determining multiple types of attributes from the image;
    reducing a number of the attributes to provide reduced attribute information;
    generating guidelines, based on the reduced attribute information and on reference data, for evaluating the reduced attribute information; and
    evaluating an actual object by implementing the guidelines.

12. A method for measuring depths and/or heights of structures on a substrate, the method comprising:
    acquiring, by a charged particle beam system, a backscattered electron image of an area of a reference object, wherein the area comprises multiple instances of a structure of interest, the structure of interest is positioned in a recess having an aspect ratio that exceeds ten, and the structure of interest is of a nanometric scale;
    determining multiple types of attributes from the image;
    reducing a number of the attributes to provide reduced attribute information;

generating guidelines, based on the reduced attribute information and on reference data, for evaluating the reduced attribute information, wherein generating the guidelines includes training a neural network to output data that approximates the reference data when fed with the reduced attribute information; and evaluating an actual object by implementing the guidelines.

13. The method according to claim 12, wherein a resolution of the image is at least one hundred times finer than a resolution of the reference data.

14. The method according to claim 12, wherein acquiring the backscattered electron image includes collecting backscattered electrons by a backscattered electron detector that has a radial angular coverage range of tens of degrees.

15. The method according to claim 14, wherein acquiring the backscattered electron image includes rejecting secondary electrons using an energy filter that precedes the backscattered electron detector.

* * * * *